United States Patent
Li et al.

(10) Patent No.: US 10,955,303 B2
(45) Date of Patent: Mar. 23, 2021

(54) LOAD SENSOR AND LOAD SENSOR INTEGRATED TYPE MULTIAXIAL ACTUATOR

(71) Applicant: MINEBEA MITSUMI Inc., Nagano (JP)

(72) Inventors: Kui Li, Yamato (JP); Kotaro Eguchi, Fujisawa (JP)

(73) Assignee: MINEBEA MITSUMI INC., Nagano (JP)

( * ) Notice: Subject to any disclaimer, the term of this patent is extended or adjusted under 35 U.S.C. 154(b) by 0 days.

(21) Appl. No.: 16/956,808

(22) PCT Filed: Dec. 26, 2018

(86) PCT No.: PCT/JP2018/047709
§ 371 (c)(1),
(2) Date: Jun. 22, 2020

(87) PCT Pub. No.: WO2019/131698
PCT Pub. Date: Jul. 4, 2019

(65) Prior Publication Data
US 2020/0393312 A1 Dec. 17, 2020

(30) Foreign Application Priority Data

Dec. 26, 2017 (JP) .............................. JP2017-250057

(51) Int. Cl.
*G01L 5/00* (2006.01)
*H05K 13/04* (2006.01)

(52) U.S. Cl.
CPC .......... *G01L 5/0076* (2013.01); *G01L 5/0038* (2013.01); *H05K 13/0409* (2018.08)

(58) Field of Classification Search
CPC . G01L 5/0076; G01L 5/0038; H05K 13/0409; F16D 3/04; F16D 3/68; A61C 17/222
(Continued)

(56) References Cited

U.S. PATENT DOCUMENTS 5,245,877 A * 9/1993 Ruark ................... E21B 19/166
73/726
6,640,646 B2 * 11/2003 Davis ................... G01L 5/0057
73/766
(Continued)

FOREIGN PATENT DOCUMENTS

CN 101636071 A 1/2010
CN 103229610 A 7/2013
(Continued)

OTHER PUBLICATIONS

International Search Report for corresponding International Application No. PCT/JP2018/047709 dated Mar. 19, 2019.
(Continued)

*Primary Examiner* — Octavia Hollington
(74) *Attorney, Agent, or Firm* — Pearne & Gordon LLP

(57) ABSTRACT

Provided is a load sensor that can precisely detect a load of pressing force to an object. A load sensor to be used for a multiaxial actuator (10) that has a drive rod (12) that linearly moves in an axial direction in a state where the drive rod (12) is contained in a housing (11), and a suction rod (22) that is arranged in parallel with the drive rod (12), linearly moves at the same time as the drive rod (12) in the axial direction, and has a tip end portion (22a) to be pressed, when a chip is to be suctioned, against the chip, includes a coupling member (30) that couples the drive rod (12) and the suction rod (22), the coupling member (30) has a first coupling part (31) that couples the drive rod (12), and a second coupling part (32) that couples the suction rod (22), and a neck part (33) that is provided between the first coupling part (31) and the second coupling part (32) and formed to be thinner than the first coupling part (31) and the second coupling part (32), and the neck part (33) includes strain gauges (41) to (44) attached to a front surface of the neck part (33).

4 Claims, 5 Drawing Sheets

(58) Field of Classification Search
USPC .................................................. 73/862.381
See application file for complete search history.

(56) References Cited

U.S. PATENT DOCUMENTS 9,109,964 B2 * 8/2015 Bao .................. G01L 5/0076
2009/0033585 A1   2/2009 Lang

FOREIGN PATENT DOCUMENTS

| CN | 103592070 A | 2/2014 |
| CN | 105870047 A | 8/2016 |
| CN | 206711871 U | 12/2017 |
| CN | 108901169 A | 11/2018 |
| JP | 05-288618 A | 11/1993 |
| JP | 2002-299894 A | 10/2002 |
| JP | 2010-003728 A | 1/2010 |
| JP | 2010-034121 A | 2/2010 |
| JP | 2010-123415 A | 6/2010 |
| JP | 2014-018072 A | 1/2014 |

OTHER PUBLICATIONS

Written Opinion for corresponding International Application No. PCT/JP2018/047709 dated Mar. 19, 2019.
Notice of Allowance dated Jun. 10, 2019 for corresponding Japanese Application No. 2017-250057 and English translation.
Chinese Office Action dated Oct. 26, 2020 for corresponding Chinese Application No. 201880084078.2 and English translation.

* cited by examiner

LOAD SENSOR AND LOAD SENSOR INTEGRATED TYPE MULTIAXIAL ACTUATOR

TECHNICAL FIELD

The present invention relates to a load sensor and a load sensor integrated type multiaxial actuator, and, for example, relates to a load sensor that detects, in a multiaxial actuator to be used as a chip mounter that mounts an electronic part (chip) to a substrate, pressing force (load) to the chip in a case where the chip is suctioned and mounted to the substrate in a state where the chip is pressed against a tip end of a shaft-like member formed to be hollow, and a load sensor integrated type multiaxial actuator.

BACKGROUND ART

Up to now, as a multiaxial actuator to be incorporated in a chip mounter, a linear motor actuator exists. This linear motor actuator is configured to cause a shaft-like member to perform linear motion in an axial direction by using a linear motor from that linear thrust can be obtained (for example, see Patent Literature 1).

DOCUMENT LIST

Patent Literature

Patent Literature 1: Japanese Patent Application Publication No. 2014-18072

SUMMARY OF INVENTION

Technical Problem

However, in the linear motor actuator described in the above-mentioned Patent Literature 1, when a chip is pressed against a tip end of a shaft-like member formed to be hollow, the chip is suctioned by taking in air by a vacuum generation apparatus, but when pressing force is insufficient, there is a risk that the attraction might fail, and when the pressing force is excessive, there is a risk that the chip might be damaged. That is, in the linear motor actuator, it is necessary to precisely detect the pressing force (load) such that the chip is pressed at appropriate pressing force.

Accordingly, in view of the aforementioned problem, it is an object of the present invention to provide a load sensor that can precisely detect a load of pressing force to an object, and a load sensor integrated type multiaxial actuator.

Solution to Problem

To achieve the above-mentioned object, a load sensor according to the present invention is a load sensor to be used for a multiaxial actuator that has a first shaft-like member that linearly moves in an axial direction in a state of being contained in a housing, and a second shaft-like member that is arranged in parallel with the first shaft-like member, linearly moves at the same time as the first shaft-like member in the axial direction, and has a tip end portion to be pressed, when a predetermined object is to be suctioned, against the object, the load sensor includes a coupling member that couples the first shaft-like member and the second shaft-like member, the coupling member has a first coupling part that couples the first shaft-like member, a second coupling part that couples the second shaft-like member, and a neck part that is provided between the first coupling part and the second coupling part and formed to be thinner than the first coupling part and the second coupling part, and the neck part includes a strain gauge attached to a front surface of the neck part.

According to the present invention, it is preferable that the strain gauge is affixed to the front surface facing a direction perpendicular to the axial direction of the first shaft-like member and the second shaft-like member in the neck part.

According to the present invention, it is preferable for the neck part that a through hole penetrating through the neck part is formed.

A load sensor integrated type multiaxial actuator according to the present invention includes a first shaft-like member that linearly moves in an axial direction in a state of being contained in a housing, a second shaft-like member that is arranged in parallel with the first shaft-like member, linearly moves at the same time as the first shaft-like member in the axial direction, and has a tip end portion to be pressed, when a predetermined object is to be suctioned, against the object, and a coupling member that couples the first shaft-like member and the second shaft-like member to cause the first shaft-like member and the second shaft-like member to linearly move at the same time in the axial direction, the coupling member has a first coupling part that couples the first shaft-like member, a second coupling part that couples the second shaft-like member, and a neck part that is provided between the first coupling part and the second coupling part and formed to be thinner than the first coupling part and the second coupling part, and the neck part includes a strain gauge attached to a front surface of the neck part.

Effects of Invention

According to the present invention, it is possible to realize a load sensor that can precisely detect a load of pressing force to an object, and a load sensor integrated type multiaxial actuator.

DESCRIPTION OF EMBODIMENTS

Embodiments

Figure 1:
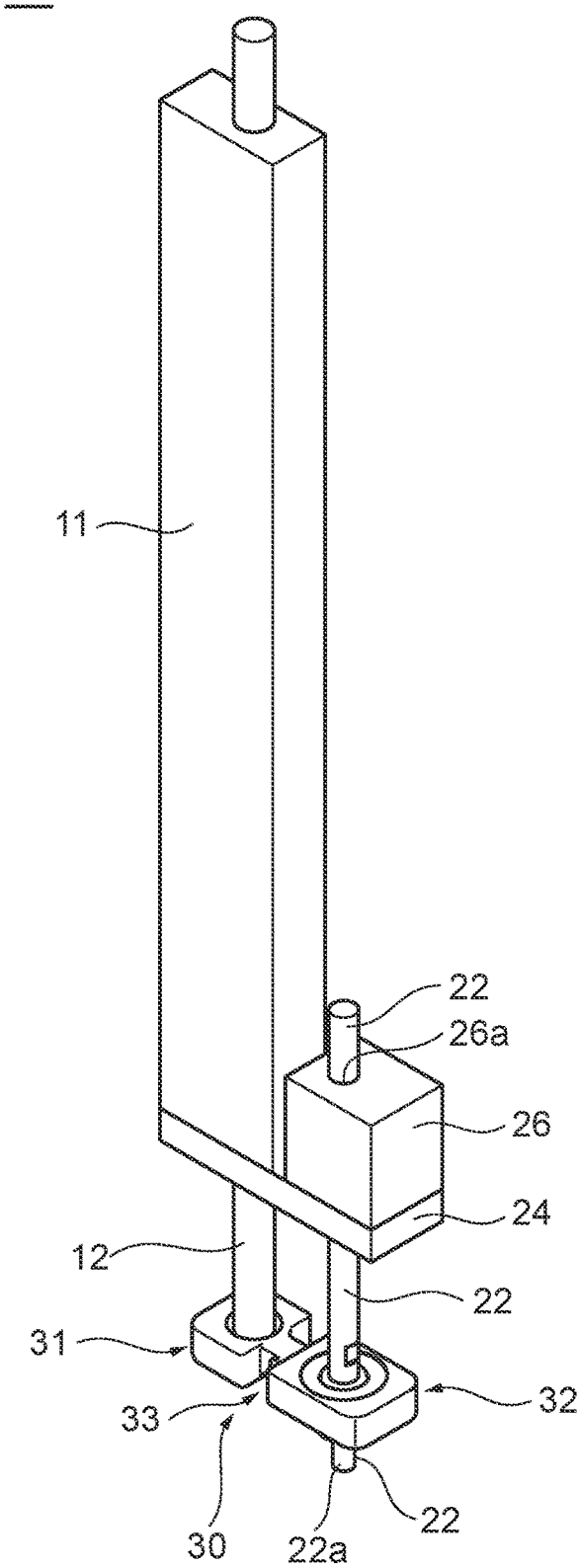
FIG. 1 An external perspective view showing an entire configuration of a load sensor integrated type multiaxial actuator according to an embodiment of the present invention.
Figure 2:
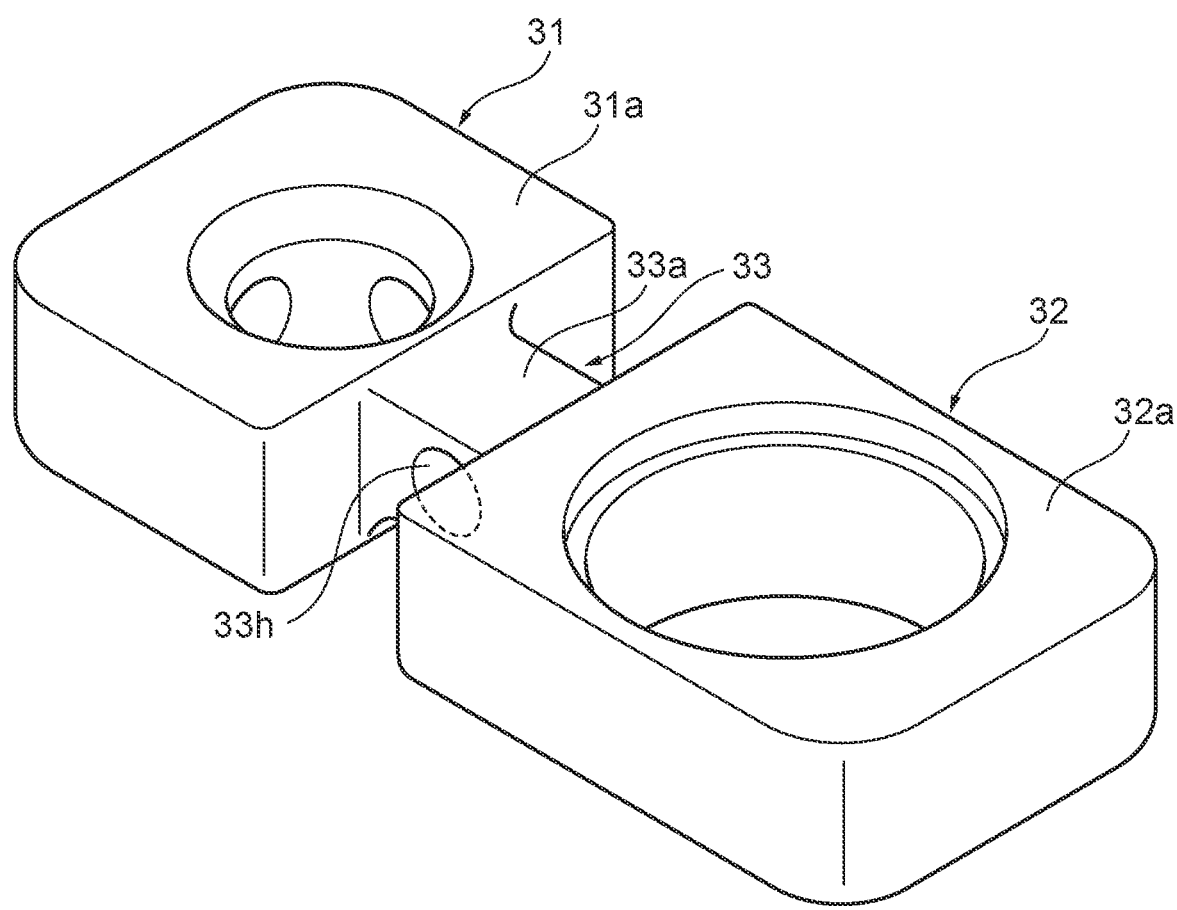
FIG. 2 A schematic enlarged perspective view showing an external configuration of a coupling member according to the embodiment of the present invention.
Figure 3:
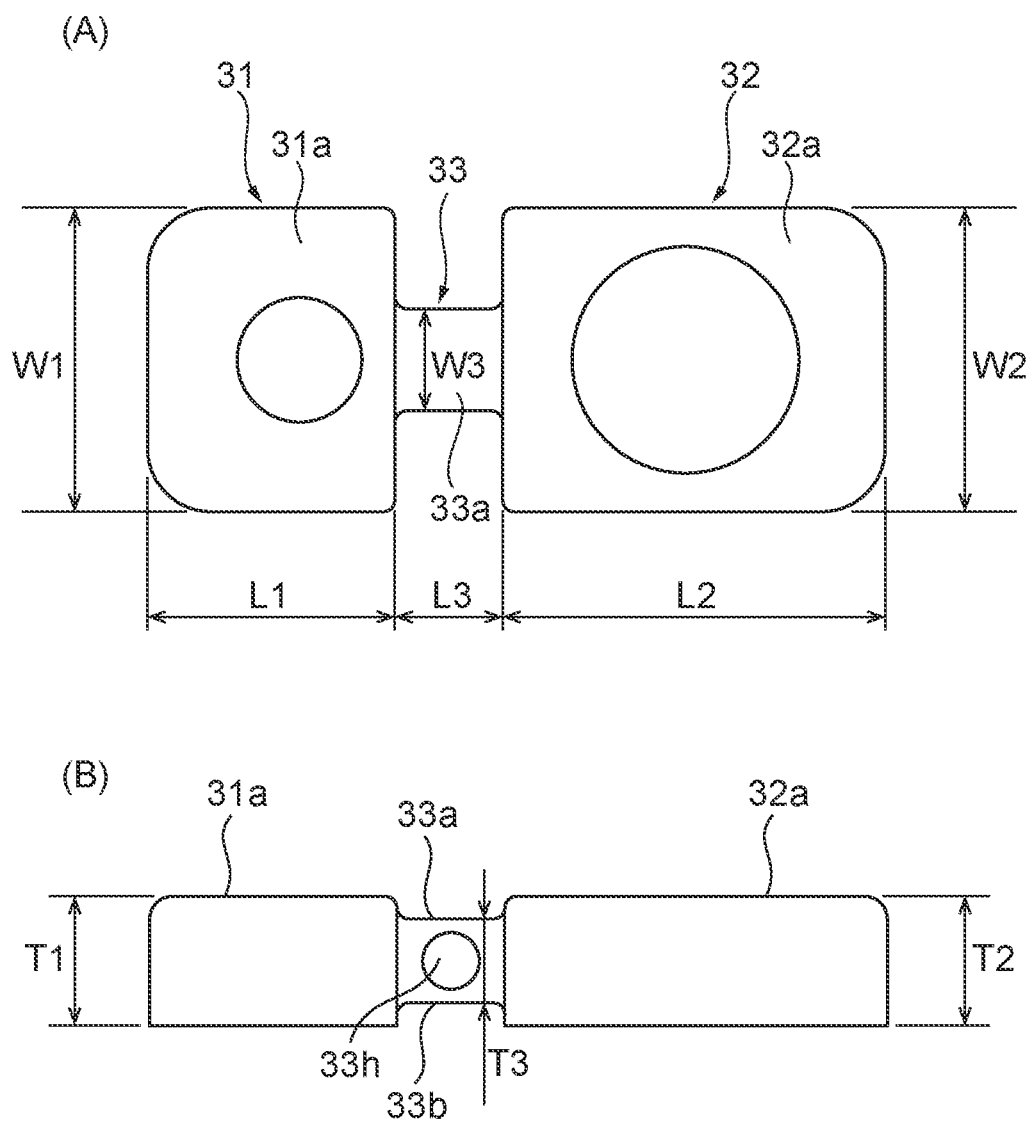
FIG. 3 A plan view and a side view showing the external configuration of the coupling member according to the embodiment of the present invention.
Figure 4:
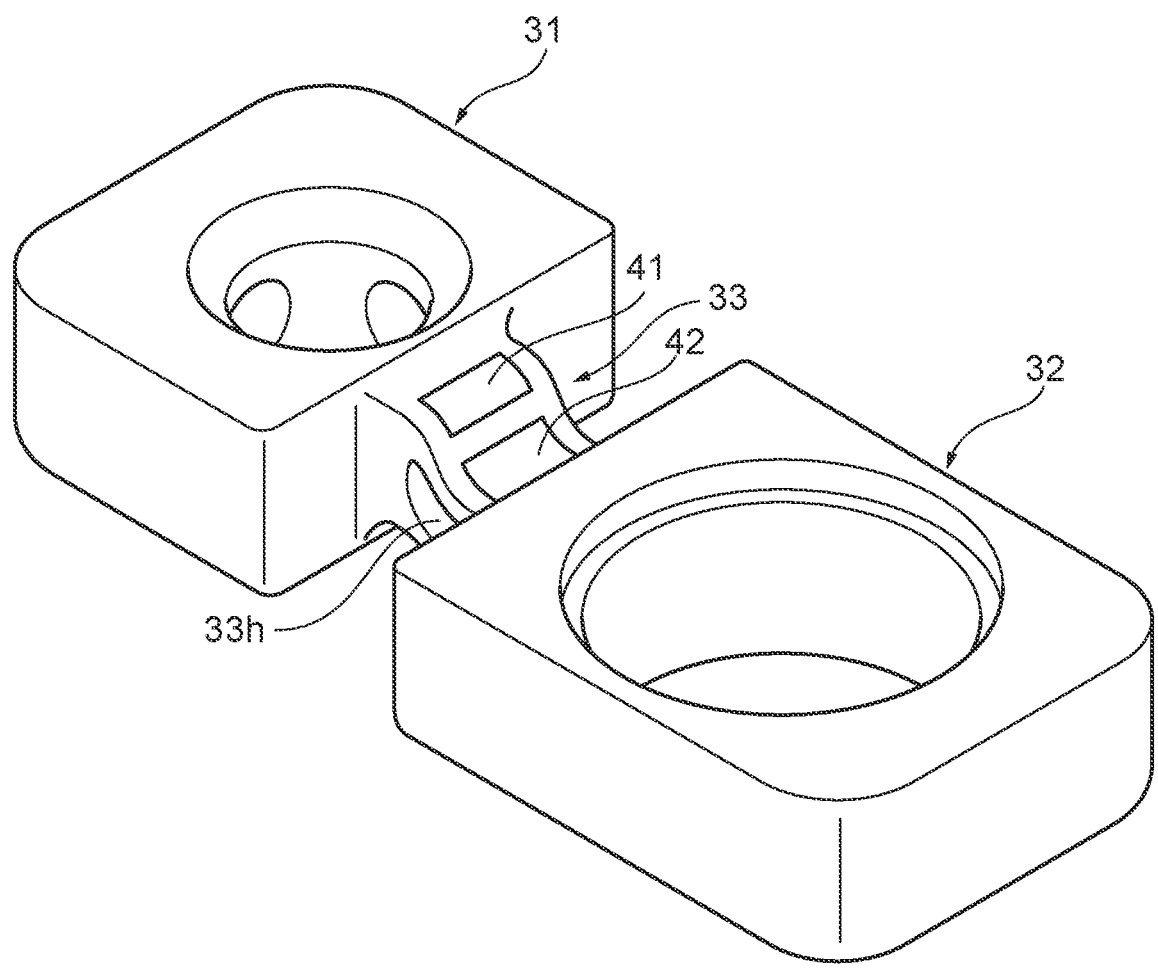
FIG. 4 An enlarged perspective view showing a state where a neck part of the coupling member is bent according to the embodiment of the present invention.
Figure 5:
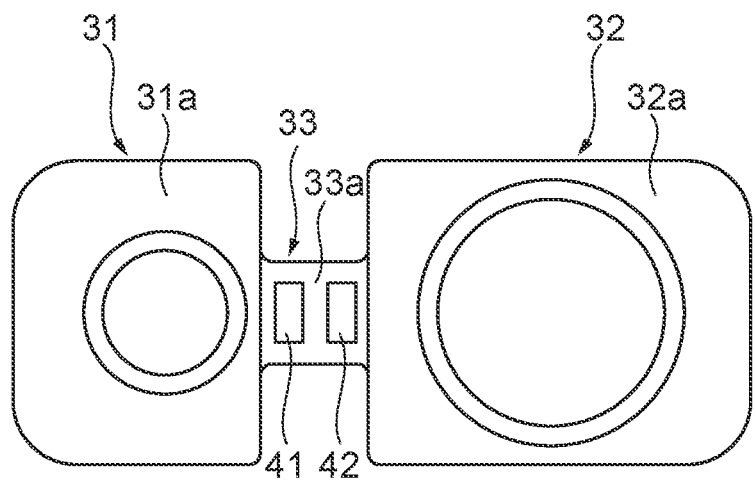
FIG. 5 Plan views showing an arrangement of strain gauges affixed to the neck part of the coupling member according to the embodiment of the present invention.
Figure 5:
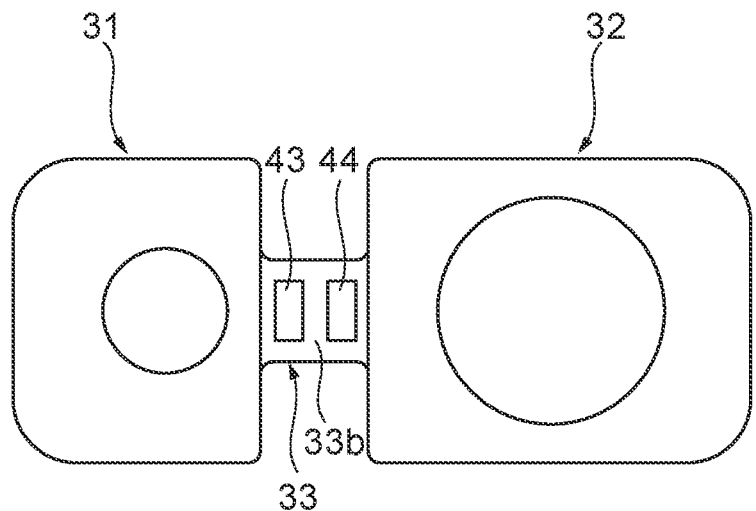

Hereinafter, embodiments of the present invention will be described with reference to the drawings. FIG. 1 is an external perspective view showing an entire configuration of a load sensor integrated type multiaxial actuator according to an embodiment of the present invention. FIG. 2 is a schematic enlarged perspective view showing an external configuration of a coupling member according to the embodiment of the present invention. FIG. 3 are a plan view and a side view showing the external configuration of the coupling member according to the embodiment of the present invention. FIG. 4 is an enlarged perspective view showing a state where a neck part of the coupling member is bent according to the embodiment of the present invention. FIG. 5 are plan views showing an arrangement of strain gauges affixed to the neck part of the coupling member according to the embodiment of the present invention.

<Overall Configuration of the Load Sensor Integrated Type Multiaxial Actuator>

As shown in FIG. 1, for example, a load sensor integrated type multiaxial actuator 10 is used by being incorporated in a chip mounter that mounts an object such as an electronic part (chip) onto a substrate.

The load sensor integrated type multiaxial actuator 10 mainly includes, for example, a housing 11 having a three-phase motor (not shown) built therein, a drive rod 12 serving as a first shaft-like member that linearly moves relatively in an axial direction by the three-phase motor, a suction rod 22 that is arranged in parallel with the drive rod 12 and serves as a second shaft-like member that suctions a chip at a tip end portion, and a coupling member 30 that integrally couples the drive rod 12 and the suction rod 22 on a tip end side and also serves as a load sensor that can detect a load when a chip is pressed against a tip end of the suction rod 22.

The housing 11 is a package that has the above-mentioned three-phase motor built therein and is made of a metal, resin, or the like, and holds the drive rod 12 in a state where the drive rod 12 is allowed to linearly move relatively along the axial direction. It is noted that the housing 11 holds the drive rod 12 via a holding plate 24 (which will be described below).

In actuality, inside the housing 11, a three-phase coil (not shown) constituted by a U phase, a V phase, and a W phase in the surrounding of the drive rod 12 is arranged, and when a current flows through the three-phase coil, the drive rod 12 linearly moves in the axial direction relative to the housing 11.

The drive rod 12 is a columnar bar-like member made of a metal, resin, or the like extending along the axial direction, and linearly moves in a predetermined stroke range in a state of being held in the housing 11 via the holding plate 24.

The suction rod 22 is a hollow cylindrical member made of a metal, resin, or the like extending along the axial direction, and is arranged in parallel with the drive rod 12, when a chip is to be suctioned, a tip end portion 22a is pressed against the chip. The suction rod 22 is attached to a casing 26 via the holding plate 24.

An external diameter of the suction rod 22 has a dimension according to a size of a chip, and is smaller than the drive rod 12. It is however noted that the configuration is not limited to this, and the external diameter of the suction rod 22 may be larger than an external diameter of the drive rod 12, and may also be substantially the same.

This suction rod 22 is connected to a vacuum pump or the like that is not shown in the drawing via a hose or the like. By the way, a suction pad (not shown) to suction a chip may be attached to the tip end portion 22a of the suction rod 22.

The casing 26 is made of a metal, resin, or the like, and in the casing 26, a through hole 26a is formed to support the suction rod 22 in such a way as to freely move relatively in the axial direction. The casing 26 supports the suction rod 22 such that the suction rod 22 can move in the axial direction along with the motion of the drive rod 12 in the axial direction.

The holding plate 24 has a cuboid shape which is made of a metal, resin, or the like, and is integrally attached to both the housing 11 and the casing 26. The holding plate 24 supports the drive rod 12 and the suction rod 22 such that the drive rod 12 and the suction rod 22 can move in the axial direction, and also suppresses turning of the suction rod 22 about the drive rod 12 in a state where a mutual positional relationship is held.

As shown in FIG. 2, the coupling member 30 is a plate-like member having a substantially cuboid shape which couples and fixes the tip end portion of the drive rod 12 and the tip end portion of the suction rod 22 and is made of a metal, resin, or the like. The coupling member 30 prevents the drive rod 12 from relatively moving in the axial direction relative to the coupling member 30, and also prevents the suction rod 22 from relatively moving in the axial direction relative to the coupling member 30.

The coupling member 30 includes a drive rod coupling part 31 serving as a first coupling part which integrally couples and fixes the tip end portion of the drive rod 12 at a front surface 31a thereof, a suction rod coupling part 32 serving as a second coupling part which integrally couples and fixes the suction rod 22 in a state where the suction rod 22 penetrates through from a front surface 32a thereof, and a neck part 33 that integrally links the drive rod coupling part 31 and the suction rod coupling part 32, and these are integrally formed.

The drive rod coupling part 31 is a part of the coupling member 30 which is located on an extended line of the axial direction of the drive rod 12. The suction rod coupling part 32 is a part of the coupling member 30 which is located on an extended line of the axial direction of the suction rod 22. The neck part 33 is a part of the coupling member 30 which integrally links the drive rod coupling part 31 and the suction rod coupling part 32, is not located on the extended lines of the axial directions of the drive rod 12 and the suction rod 22, and extends in a direction perpendicular to the axial direction. This coupling member 30 can be formed by injection molding or cutting.

The drive rod coupling part 31 is a fixing part that has a substantially cubic shape and fixes the tip end portion of the drive rod 12. The fixing method can be based on various methods such as screw fixing and engagement by interference fit.

The suction rod coupling part 32 is a fixing part that has a substantially cuboid shape and fixes the tip end portion 22a of the suction rod 22 in a penetrating state. The fixing method is similar to the drive rod coupling part 31, and can be based on various methods such as screw fixing and engagement by interference fit.

As shown in FIG. 2 and FIG. 3, the neck part 33 is a neck-like member that has a thickness thinner than the drive rod coupling part 31 and the suction rod coupling part 32, and links the drive rod coupling part 31 and the suction rod coupling part 32. Here, a longitudinal direction of the coupling member 30 is set as a length L, a short direction of the coupling member 30 is set as a width W, and the axial direction of the drive rod 12 and the suction rod 22 of the coupling member 30 is set as a height T, and descriptions will be hereinafter provided.

A length L3 of the neck part 33 is shorter than a length L1 of the drive rod coupling part 31 and a length L2 of the suction rod coupling part 32. A width W3 of the neck part 33 is shorter than a width W1 of the drive rod coupling part 31 and a width W2 of the suction rod coupling part 32.

A height T3 of the neck part 33 is lower than a height T1 of the drive rod coupling part 31 and a height T2 of the suction rod coupling part 32. Furthermore, the neck part 33 has a through hole 33*h* having a predetermined inner diameter along a width direction perpendicular to the axial direction of the drive rod 12 and the suction rod 22 on a front surface thereof.

That is, as shown in FIG. 4, the neck part 33 is thinner than the drive rod coupling part 31 and the suction rod coupling part 32, and the neck part 33 is also more easily bent than the drive rod coupling part 31 and the suction rod coupling part 32 due to the presence of the through hole 33*h*.

As shown in FIGS. 5(A) and (B), among front surfaces of the neck part 33, strain gauges 41 and 42 are affixed on an upper surface 33*a* facing an upper direction where the housing 11 and the casing 26 exist, and also strain gauges 43 and 44 are affixed on a lower surface 33*b* facing a lower direction where a chip as a suction target exists.

The strain gauges 41 to 44 use a phenomenon where resistance values change when internally arranged resistance elements expand or contract together with a deflection (strain) generated in the neck part 33, and a so-called bridge circuit is constituted. In the bridge circuit, it is possible to measure a load according to a deflection (strain) on the basis of a change of a voltage of the resistance elements of the strain gauges 41 to 44.

In this case, in conjunction with pressing-down of the drive rod 12, the suction rod 22 is pressed down together with the coupling member 30, and when the tip end portion 22*a* of the suction rod 22 is pressed against a chip, reactive force (load) from the chip to the suction rod coupling part 32 becomes a load to the neck part 33.

At this time, as has been shown in FIG. 4, since only the neck part 33 is bent by the reactive force from the chip, the strain gauges 41 to 44 are affixed to these bent parts. These bent parts are areas having a thin thickness due to the through hole 33*h* of the neck part 33, and function as strain body parts.

It is noted that in the neck part 33, the configuration is not limited to only a case where the strain gauges 41 and 42 are affixed to on the upper surface 33*a* and the strain gauges 43 and 44 are also affixed to on the lower surface 33*b*, and all of the strain gauges 41 to 44 may also be affixed to either the upper surface 33*a* or the lower surface 33*b*. As long as the load to the suction rod coupling part 32 can be precisely measured, the affixation positions of the strain gauges 41 to 44 to the neck part 33 are not particularly limited. In addition, the number of the strain gauges to be affixed to the neck part 33 does not necessarily need to be four, and at least one may be affixed to either the upper surface 33*a* or the lower surface 33*b*.

According to the above-mentioned configuration, the load sensor integrated type multiaxial actuator 10 includes the coupling member 30 serving as a load sensor, and the strain gauges 41 to 44 are affixed to the front surface of the neck part 33 that links the drive rod coupling part 31 and the suction rod coupling part 32 of the coupling member 30 and is thinner than the drive rod coupling part 31 and the suction rod coupling part 32.

Since the neck part 33 of the coupling member 30 has rigidity lower than the drive rod coupling part 31 and the suction rod coupling part 32, as has been shown in FIG. 4, when the tip end portion 22*a* of the suction rod 22 is pressed against a chip, only the neck part 33 is bent by reactive force (load) from the chip to the suction rod coupling part 32.

In particular, since an area having a thin thickness due to the through hole 33*h* of the neck part 33 is most likely to bend and the strain gauges 41 to 44 are affixed to this bending part (strain body part), the load sensor integrated type multiaxial actuator 10 can precisely measure pressing force (load) of the suction rod 22 to a chip by the strain gauges 41 to 44 of the coupling member 30.

OTHER EMBODIMENTS

It is noted that according to the above-mentioned embodiment, the case has been described where the through hole 33*h* is formed in the neck part 33 of the coupling member 30, but the present invention is not limited to this. The through hole 33*h* does not necessarily need to be formed in the neck part 33. In a case where the neck part 33 is formed to be thin to such an extent that a deflection occurs earlier than the drive rod coupling part 31 and the suction rod coupling part 32 when reactive force from a chip is applied to the suction rod coupling part 32, the through hole 33*h* does not necessarily need to be formed.

Furthermore, according to the above-mentioned embodiment, the case has been described where the drive rod coupling part 31 is set to have a substantially a cubic shape and the suction rod coupling part 32 is set to have a substantially a cuboid shape, but the configuration is not limited to this, and various other shapes such as a columnar shape may also be adopted as long as the neck part 33 is bent first.

Furthermore, according to the above-mentioned embodiment, the length L3 of the neck part 33 is set to be shorter than the length L1 of the drive rod coupling part 31 and the length L2 of the suction rod coupling part 32, the width W3 of the neck part 33 is set to be shorter than the width W1 of the drive rod coupling part 31 and the width W2 of the suction rod coupling part 32, and the height T3 of the neck part 33 is set to be lower than the height T1 of the drive rod coupling part 31 and the height T2 of the suction rod coupling part 32. However, the present invention is not limited to this, and when the height T3 of the neck part 33 is set to be shorter than the height T1 of the drive rod coupling part 31 and the height T2 of the suction rod coupling part 32, the length L3 of the neck part 33 may also be set to be substantially the same as or longer than the length L1 of the drive rod coupling part 31 and the length L2 of the suction rod coupling part 32, or the width W3 of the neck part 33 may also be set to be substantially the same as or longer than the width W1 of the drive rod coupling part 31 and the width W2 of the suction rod coupling part 32.

The preferred embodiments of the present invention have been described above, but the present invention is not limited to the load sensor integrated type multiaxial actuator 10 and the coupling member 30 according to the above-mentioned embodiment, and includes any mode that may be included in the concept of the present invention and the scope of the claims. In addition, to exhibit at least a part of the above-mentioned problem and effects, respective configurations may be appropriately selectively combined. For example, shapes, materials, arrangements, sizes, and the like of respective components according to the above-mentioned embodiment may be appropriately changed depending on specific use modes of the present invention.

LIST OF REFERENCE SIGNS

10 load sensor integrated type multiaxial actuator
11 housing 12 drive rod (first shaft-like member)
22 suction rod (second shaft-like member)
22a tip end portion
24 holding plate
26 casing
26a through hole
30 coupling member
31 drive rod coupling part (first coupling part)
32 suction rod coupling part (second coupling part)
33 neck part (strain body part)
33a upper surface
33b lower surface
33h through hole
L1 to L3 length
W1 to W3 width
T1 to T3 height
41 to 44 strain gauge

The invention claimed is:

1. A load sensor to be used for a multiaxial actuator that has a first shaft-like member that linearly moves in an axial direction in a state of being contained in a housing, and a second shaft-like member that is arranged in parallel with the first shaft-like member, linearly moves at the same time as the first shaft-like member in the axial direction, and has a tip end portion to be pressed, when a predetermined object is to be suctioned, against the object, the load sensor comprising:
   a coupling member that couples the first shaft-like member and the second shaft-like member, wherein
   the coupling member has a first coupling part that couples the first shaft-like member, a second coupling part that couples the second shaft-like member, and a neck part that is provided between the first coupling part and the second coupling part and formed to be thinner than the first coupling part and the second coupling part, and
   the neck part includes a strain gauge attached to a front surface of the neck part.

2. The load sensor according to claim 1, wherein the strain gauge is affixed to the front surface facing a direction perpendicular to the axial direction of the first shaft-like member and the second shaft-like member in the neck part.

3. The load sensor according to claim 1, wherein the neck part has a through hole formed penetrating through the neck part.

4. A load sensor integrated type multiaxial actuator comprising:
   a first shaft-like member that linearly moves in an axial direction in a state of being contained in a housing;
   a second shaft-like member that is arranged in parallel with the first shaft-like member, linearly moves at the same time as the first shaft-like member in the axial direction, and has a tip end portion to be pressed, when a predetermined object is to be suctioned, against the object; and
   a coupling member that couples the first shaft-like member and the second shaft-like member to cause the first shaft-like member and the second shaft-like member to linearly move at the same time in the axial direction, wherein
   the coupling member has a first coupling part that couples the first shaft-like member, a second coupling part that couples the second shaft-like member, and a neck part that is provided between the first coupling part and the second coupling part and formed to be thinner than the first coupling part and the second coupling part, and
   the neck part includes a strain gauge attached to a front surface of the neck part.

* * * * *